US010920338B1

(12) United States Patent
Kim

(10) Patent No.: US 10,920,338 B1
(45) Date of Patent: Feb. 16, 2021

(54) DRIVING UNIT MEASURING APPARATUS AND SILICON CRYSTAL GROWING APPARATUS HAVING SAME

(71) Applicant: SK SILTRON CO., LTD., Gumi-si (KR)

(72) Inventor: Woo Tae Kim, Gumi-si (KR)

(73) Assignee: SK SILTRON CO., LTD., Gumi-Si (*) Notice: Subject to any disclaimer, the term of this patent is extended or adjusted under 35 U.S.C. 154(b) by 71 days.

(21) Appl. No.: 16/545,490

(22) Filed: Aug. 20, 2019

(30) Foreign Application Priority Data

Jul. 22, 2019 (KR) .................. 10-2019-0088179

(51) Int. Cl.
C30B 15/20 (2006.01)
C30B 29/06 (2006.01)

(52) U.S. Cl.
CPC .............. *C30B 15/20* (2013.01); *C30B 29/06* (2013.01)

(58) Field of Classification Search
CPC ......... C30B 15/02; C30B 15/26; C30B 15/20; C30B 15/22; C30B 35/00
See application file for complete search history.

(56) References Cited

U.S. PATENT DOCUMENTS 8,257,496 B1* 9/2012 Bender .................. C30B 15/02
117/206
9,228,878 B2* 1/2016 Haw ..................... G01F 23/292
2010/0128253 A1* 5/2010 Yanagimachi .......... C30B 15/26
356/30

FOREIGN PATENT DOCUMENTS

JP 2016-538226 12/2016
KR 10-2011-0099488 9/2011

OTHER PUBLICATIONS

Japanese Office Action dated Jun. 24, 2020 issued in Application No. 2019-152768 (English translation attached).
Korean Office Action dated Sep. 3, 2020 issued in Application No. 10-2019-0088179.

* cited by examiner

*Primary Examiner* — Robert M Kunemund
(74) *Attorney, Agent, or Firm* — Ked & Associates LLP

(57) ABSTRACT

The present invention provides a driving unit measuring apparatus, the apparatus including: a crucible support for supporting a crucible; a pulling unit for elevating or rotating a seed at an upper portion of the crucible; a crucible driving unit for rotating or elevating the crucible support; a flat nut detachably coupled to the pulling unit; a crucible shaft inspection jig detachably coupled to the crucible driving unit; and a displacement measuring unit coupled to the flat nut and the crucible shaft inspection jig and measuring at least one of elevation and rotational displacement of the pulling unit and the crucible driving unit.

18 Claims, 8 Drawing Sheets

[FIG.1]
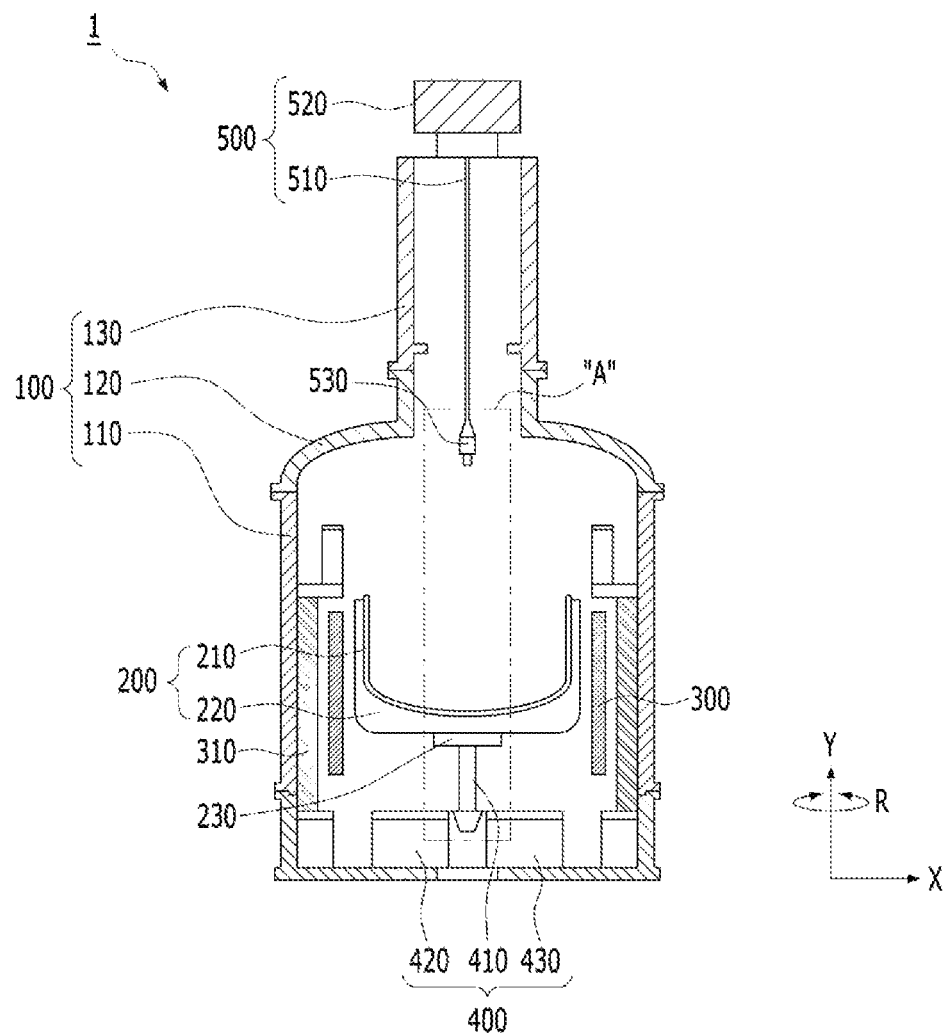

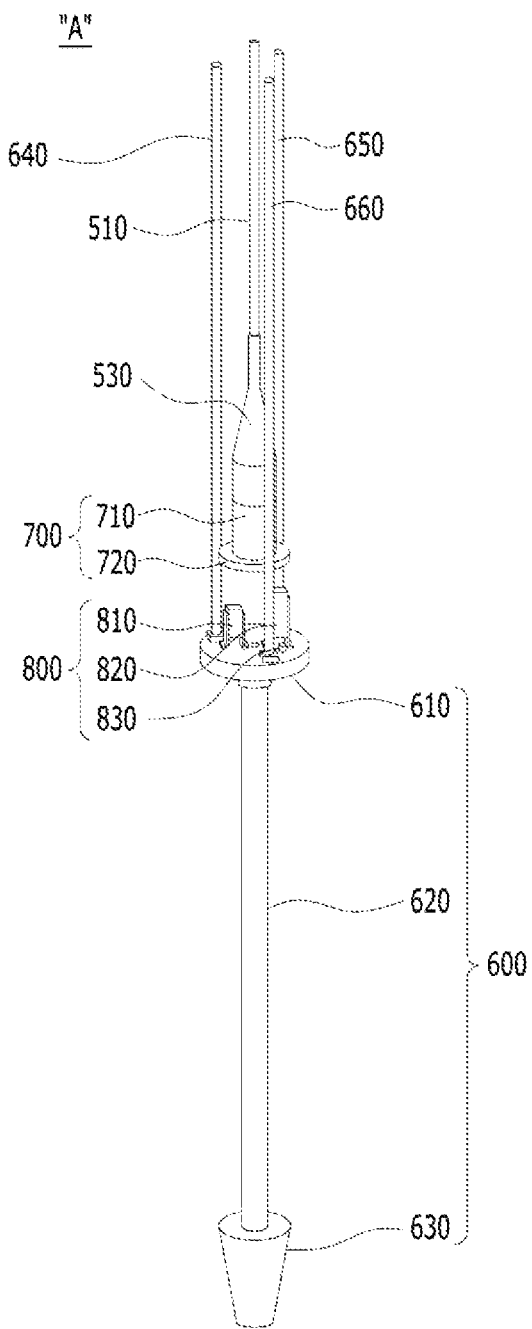
[FIG. 2]

[FIG. 3]
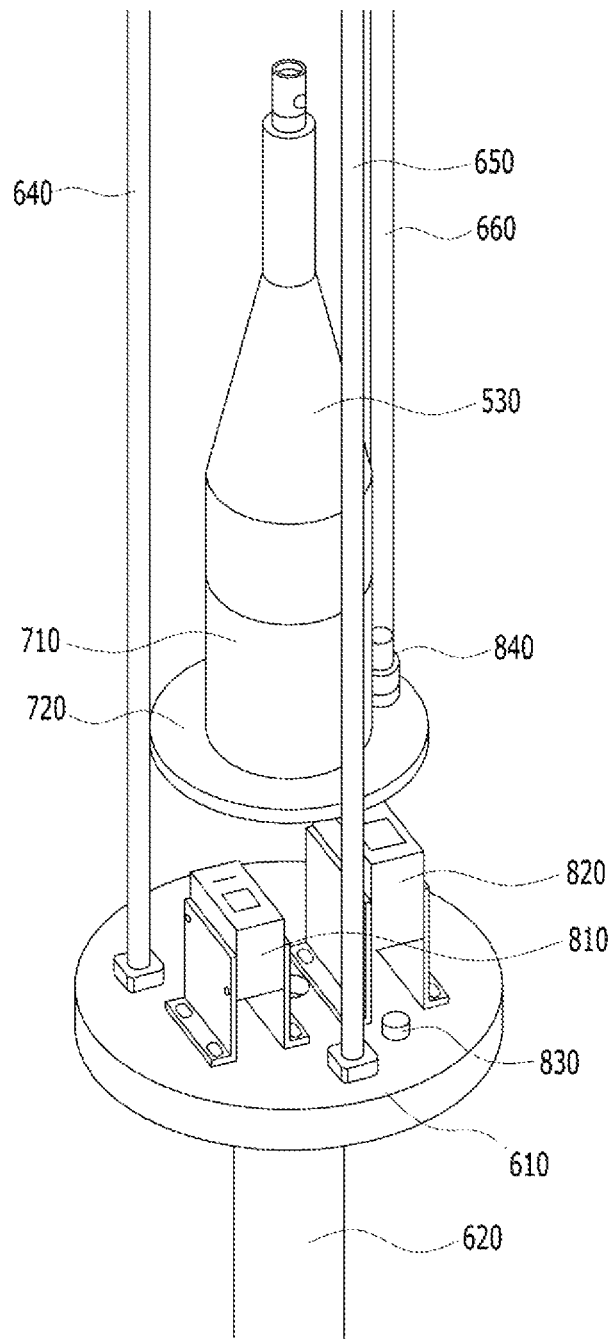

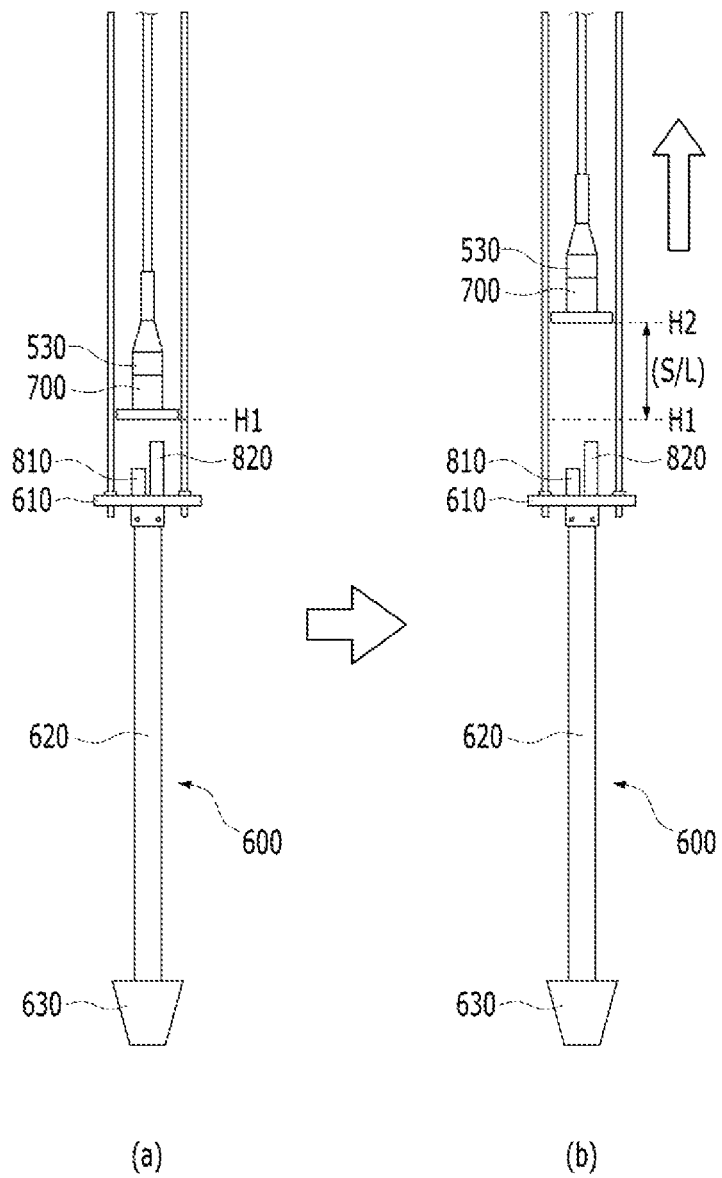
[FIG. 4]
(a)        (b)

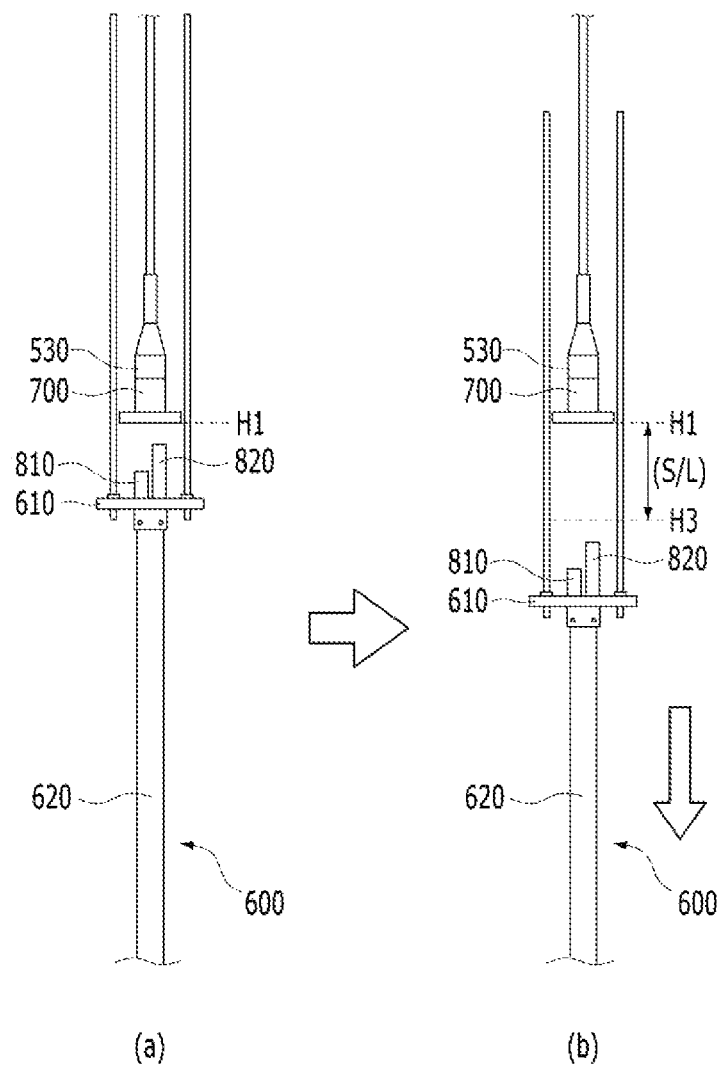
[FIG. 5]

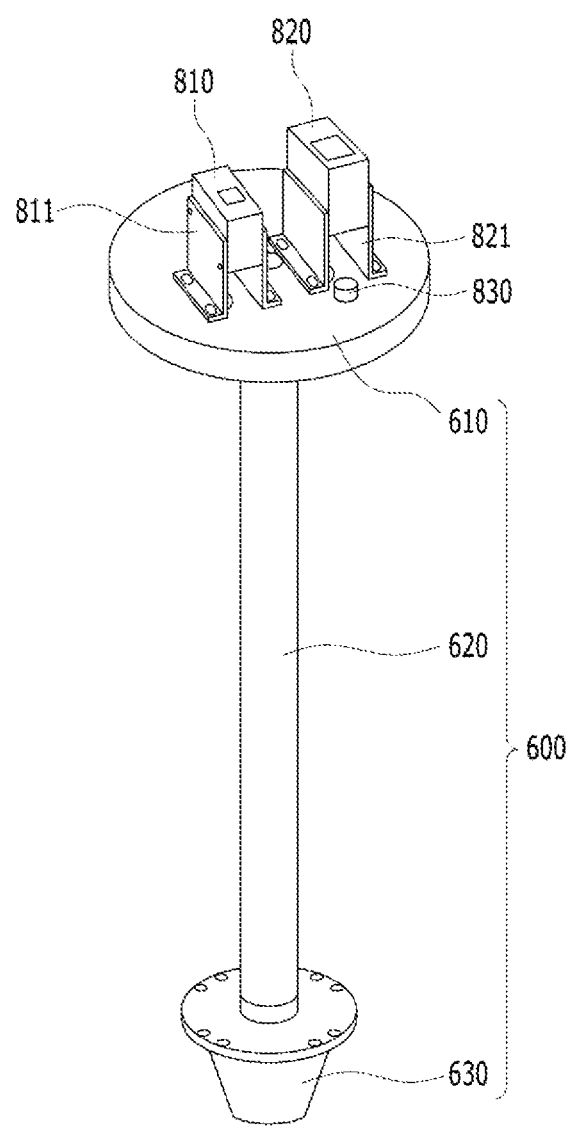
[FIG. 6]

【FIG. 7】
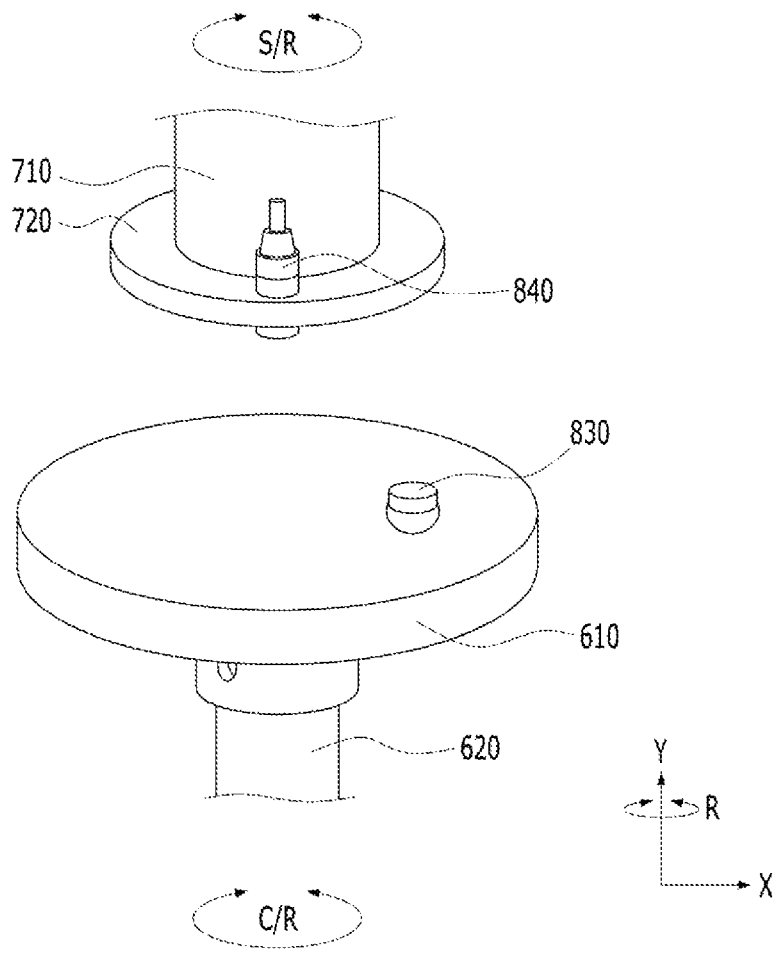

[FIG. 8]
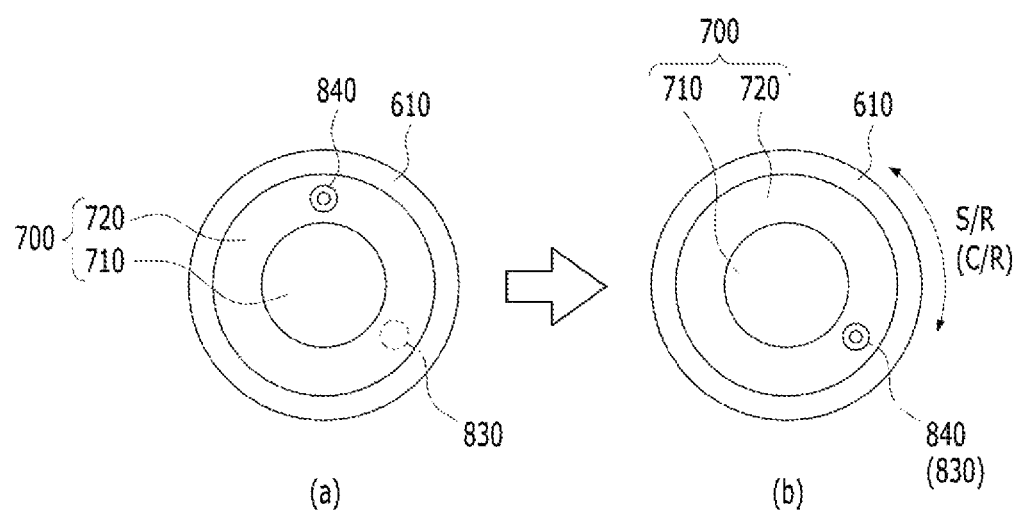

DRIVING UNIT MEASURING APPARATUS AND SILICON CRYSTAL GROWING APPARATUS HAVING SAME

CROSS-REFERENCE TO RELATED APPLICATION(S)

This application claims priority under 35 U.S.C. § 119 to Korean Patent Application No. 10-2019-0088179, filed on Jul. 22, 2019, which is hereby incorporated in its entirety by reference as if fully set forth herein.

TECHNICAL FIELD

The present invention relates to a silicon single crystal growing apparatus, and more particularly, to an apparatus for precisely measuring a driving unit that drives a crucible and a seed cable, respectively.

BACKGROUND

A fabricating process of a silicon wafer includes a single crystal growing process for fabricating a single crystal silicon ingot, a slicing process for obtaining a thin disk-shaped wafer by slicing a single crystal ingot, an edge grinding process for machining an outer circumferential portion of a wafer to prevent cracking and distortion of the wafer obtained by the slicing process, a lapping process for removing damages due to mechanical processing remaining on a wafer to improve flatness of the wafer, a polishing process for mirror-polishing a wafer, and a cleaning process for removing abrasive or foreign substances adhering to a wafer.

Of these, in the single crystal growing process, a single crystal ingot is grown gradually from a seed through a single crystal growing apparatus.

The single crystal growing apparatus may include a chamber in which a space is formed therein, a crucible installed in the chamber and into which a polycrystalline raw material is charged and melted, a heating unit for heating the crucible so as to melt the raw material to form a silicon melt solution, and a pulling unit that gradually pulls up a single crystal ingot grown by immersing a seed in the silicon melt solution.

In the single crystal growing process, the crucible may be rotated or elevated vertically by a crucible driving unit. In addition, the pulling unit may include a seed cable, a cable driving unit capable of elevating/rotating the seed cable, and a seed chuck mounted on an end of the seed cable to suspend a silicon seed.

As described above, in the single crystal growing apparatus, the crucible and the seed cable may perform vertical elevation or axial rotation needed for seed growth by the crucible driving unit and the pulling unit, respectively.

Here, the crucible driving unit and the pulling unit, that is, the driving unit of the single crystal growing apparatus, may control quality of the single crystal growth ingot by driving the crucible and the seed cable at an appropriate speed and displacement.

However, since the measurement of the driving unit of the single crystal growing apparatus has been verified and corrected through visual observation, calculation, and the like with a naked eye of a worker in the related art, there is a problem that the process is complicated and the reliability of accuracy is lowered. In addition, the shaft for rotating the crucible and the seed cable for pulling up the seed are consumables and worn out as the number of times of uses increases.

However, since the above-described measurement method is a method of measuring the driving unit without considering the degree of wear of consumables, there is a problem that it is difficult to accurately measure a state of the driving unit.

SUMMARY

Therefore, the present invention is directed to providing a driving unit measuring apparatus and a silicon single crystal growing apparatus including the same capable of measuring a driving unit with higher accuracy and ease and accurately controlling speed and displacement of the driving unit through speed verification of the driving unit.

The present invention provides a driving unit measuring apparatus, the apparatus including: a crucible support for supporting a crucible; a pulling unit for elevating or rotating a seed at an upper portion of the crucible; a crucible driving unit for rotating or elevating the crucible support; a flat nut detachably coupled to the pulling unit; a crucible shaft inspection jig detachably coupled to the crucible driving unit; and a displacement measuring unit coupled to the flat nut and the crucible shaft inspection jig and measuring at least one of elevation and rotational displacement of the pulling unit and the crucible driving unit.

The crucible driving unit may include: a crucible shaft for rotating the crucible support; a crucible shaft rotating part for rotating the crucible shaft; and a crucible shaft pulling part for moving the crucible shaft up and down.

The crucible shaft inspection jig may be coupled to be substituted for the crucible shaft.

The crucible shaft inspection jig may include: a base plate; a shaft having one end coupled to a central region of the base plate; and a tapered bush coupled to the other end of the shaft.

The base plate may have a disk shape.

The base plate may have a flat upper surface so as to be parallel to the flat nut.

The tapered bush may have a pointed shape from an upper portion to a lower portion.

The flat nut may include: a horizontal plate disposed side by side with the base plate; and a weight connecting part coupled to the pulling unit from an upper portion of the horizontal plate.

The pulling unit may include: a seed cable; a pulling unit for elevating or rotating one end of the seed cable; and a seed chuck mounted to the other end of the seed cable.

The weight connecting part may be detachably coupled to the seed chuck.

The weight connecting part may have screw threads formed on an inner side thereof, and may be screwed to the seed chuck.

The displacement measuring unit may include at least one displacement sensor coupled to the crucible shaft inspection jig.

The displacement measuring unit may include: a first displacement sensor coupled to the crucible shaft inspection jig; a second displacement sensor coupled to the crucible shaft inspection jig; and a reference nut coupled to the crucible shaft inspection jig.

The first and second displacement sensors and the reference nut may be installed on an upper portion of the base plate of the crucible shaft inspection jig.

The displacement measuring unit may further include a proximity sensor coupled to the flat nut to measure rotational displacement.

The proximity sensor and the reference nut may be disposed concentrically with respect to the rotation center axis of the flat nut and the crucible shaft inspection jig.

The displacement measuring unit may further include a guide coupled to the crucible shaft inspection jig to guide movement of the flat nut and the crucible shaft inspection jig.

The guide may include a plurality of bar-shaped members coupled to an edge region of the base plate of the crucible shaft inspection jig.

Meanwhile, the present invention provides a driving unit measuring apparatus, the apparatus including: a chamber; a pulling unit having a seed cable for fixing a seed at an upper portion of the chamber, a pulling part for elevating or rotating one end of the seed cable, and a seed chuck mounted to the other end of the seed cable, and elevating or rotating the seed; a crucible driving unit having a crucible shaft, a crucible shaft rotating part for rotating the crucible shaft, and a crucible shaft pulling part for elevating the crucible shaft, and rotating or elevating the crucible at a lower portion of the chamber; a flat nut detachably coupled to the pulling unit; a crucible shaft inspection jig detachably coupled to the crucible driving unit instead of the crucible shaft; and a displacement measuring unit coupled to the flat nut and the crucible shaft inspection jig, and measuring at least one of elevation and rotational displacement of the pulling unit and the crucible driving unit.

Meanwhile, the present invention provides a silicon single crystal growing apparatus including any one of the driving unit measuring apparatuses described above.

BRIEF DESCRIPTION OF THE DRAWINGS

FIG. 1 is a block diagram of a single crystal growing apparatus according to one embodiment.

FIG. 2 is a perspective view of a driving unit measuring apparatus of a single crystal growing apparatus according to one embodiment.

FIG. 3 is an enlarged view of a main part of FIG. 2.

FIG. 4 is a front view of FIG. 2 and shows a process of measuring vertical displacement of a seed cable.

FIG. 5 is a front view of FIG. 2 and shows a process of measuring vertical displacement of a crucible shaft inspection jig.

FIG. 6 is an enlarged perspective view of a crucible shaft inspection jig and a region of a displacement measuring unit in FIG. 2.

FIG. 7 is an enlarged view of a main portion of FIG. 3, and shows a displacement measuring unit for measuring rotational displacement.

FIG. 8 shows a process of measuring rotational displacement by a displacement measuring unit.

DETAILED DESCRIPTION OF THE EMBODIMENTS

Hereinafter, embodiments will be shown more apparent through the description of the appended drawings and embodiments. In the description of the embodiment, when it is described that each layer (film), region, pattern, or structure is formed "above/on" or "below/under" a substrate, each layer (film), region, pad or pattern, the description includes being formed both "directly" or "indirectly (by interposing another layer)" "above/on" and "below/under".

Also, a standard of above/on or below/under of each layer will be described with respect to the drawings.

A size in the drawings may be exaggerated, omitted, or schematically described for a convenient and precise description. In addition, the size of each component does not fully match the actual size thereof. Further, like reference numbers represent like elements through description of the drawings.

Hereinafter, a raw material supplying unit and a single crystal growing apparatus having the same will be described with reference to the accompanying drawings.

FIG. 1 is a block diagram of a single crystal growing apparatus according to one embodiment.

As shown in FIG. 1, a single crystal growing apparatus 1 according to one embodiment of the present invention includes a chamber 100, a crucible 200, a heating unit 300, a crucible driving unit 400, a pulling unit 500, and a driving unit measuring apparatus "A".

The chamber 100 may form a space in which a single crystal growth process is performed, and a driving unit measurement process may also be performed inside the chamber 100. The chamber 100 may include a body chamber 110, a dome chamber 120, and a pull chamber 130 depending on a position to which the chamber 100 is coupled.

The crucible 200 may be installed in the body chamber 110, and the dome chamber 120 may form a cover part at an upper end of the body chamber 110. The body chamber 110 and the dome chamber 120 provide an environment for growing a polycrystalline silicon raw material into a silicon single crystal ingot, and may be a cylinder having an accommodating space therein. The pull chamber 130 is located at the upper end of the dome chamber 120, and may be a space for pulling the grown silicon single crystal ingot.

The crucible 200 may be disposed inside the body chamber 110, and may be supported by a crucible support 230 located at a lower portion of the crucible 200. The crucible 200 may have a dual structure of a quartz crucible 210 and a graphite crucible 220 surrounding the quartz crucible 210. The crucible 200 may be supported by the crucible support 230. The crucible 200 may be rotated or elevated by the crucible driving unit 400 that rotates or elevates the crucible support 230.

The heating unit 300 may be disposed inside the body chamber 110 to be spaced apart from an outer circumferential surface of the crucible 200. A raw material in the crucible 200 may be converted into a silicon melt solution by heating the crucible 200 by the heating unit 300. A heat insulating material 310 may be installed between the heating unit 300 and an inner wall of the body chamber 110 to prevent heat of the heating unit 300 from leaking out of the body chamber 110.

The crucible driving unit 400 may rotate or elevate the crucible support 230 to elevate or rotate the crucible 200 inside the chamber 100. For example, the crucible driving unit 400 may include a crucible shaft 410, a crucible shaft rotating part 420, and a crucible shaft pulling part 430.

The crucible shaft 410 may rotate the crucible 200 while rotating in an axial direction while supporting a central region of the crucible support 230. The crucible shaft 410 may be replaced with a new part after use for a certain period of time as a subsidiary material, i.e., a consumable. In addition, when measuring a state of the crucible driving unit 400 using the driving unit measuring apparatus "A" of an embodiment, the crucible shaft 410 may be separated from the crucible driving unit 400. That is, when measuring the driving unit, the crucible shaft 410 may be replaced with a crucible shaft inspection jig 600 (see FIGS. 2 to 6) to be described later.

The crucible shaft rotating part 420 may rotate the crucible shaft 410. For example, the crucible shaft rotating part 420 may include components such as a drive motor, a pulley, a belt, and the like, although not shown in detail.

The crucible shaft pulling part 430 may elevate the crucible shaft 410 to a predetermined height inside the chamber. For example, the crucible shaft pulling part 430 may include a drive motor and a cylinder, a pulley, a belt, and the like.

As described above, the crucible driving unit 400 including the crucible shaft 410, the crucible shaft rotating part 420, and the crucible shaft pulling part 430 may rotate or elevate the crucible 200 inside the chamber by rotating or elevating the crucible shaft 410.

That is, the crucible driving unit 400 may provide the crucible 200 with driving force corresponding to crucible rotation (C/R) and crucible lift (C/L). Therefore, the driving unit measuring apparatus "A" may measure whether the C/R and the C/L of the crucible driving unit 400 belong to a normal range and wear, tilt, and the like of the crucible shaft 410.

The pulling unit 500 may elevate or rotate a seed at an upper portion of the crucible 200. The pulling unit 500 may include a fixing part 510 for fixing and supporting the seed or an object to be grown, a pulling part 520, one end of which is connected to the fixing part 510, for moving up or down a grown object (e.g., a single crystal ingot), and a coupling part 530 mounted to the other end of the fixing part 510 and coupled to the object.

The fixing part 510 may be a cable type or a shaft type, and the coupling part 530 may be connected to one end thereof. The fixing part 510 may be referred to as a seed cable (hereinafter referred to as a seed cable). The coupling part 530 has a predetermined weight and may be detachably coupled to the seed or a flat nut 700 of the driving unit measuring apparatus "A" described later. The coupling part 530 may be referred to as a seed chuck or the like.

The pulling part 520 may move up or down an object connected to the seed cable 510 by using a motor or the like. That is, the pulling part 520 may provide seed rotation (S/R) and seed lift (S/L) to the seed cable 510. Therefore, the driving unit measuring apparatus "A" may measure whether the S/R and S/L of the seed cable 510 belong to a normal range and wear, tilt, and the like of the seed cable 510.

As described above, in the single crystal growing apparatus 1, the crucible 200 and the seed cable 510 may perform elevation in a vertical direction Y or rotation in an axial direction R by the crucible driving unit 400 and the pulling unit 500 (C/R, C/L, S/R, S/L).

The driving unit measuring apparatus "A" may precisely measure the elevation in the vertical direction Y or the rotation in the axial direction R of the crucible driving unit 400 and the pulling unit 500 described above.

FIG. 2 is a perspective view of a driving unit measuring apparatus of a single crystal growing apparatus according to one embodiment of the present invention, FIG. 3 is an enlarged view of a main part of FIG. 2, FIG. 4 is a front view of FIG. 2 and shows a process of measuring vertical displacement of a seed cable, FIG. 5 is a front view of FIG. 2 and shows a process of measuring vertical displacement of a crucible shaft inspection jig, FIG. 6 is an enlarged perspective view of a crucible shaft inspection jig and a region of a displacement measuring unit in FIG. 2, FIG. 7 is an enlarged view of a main portion of FIG. 3 and shows a displacement measuring unit for measuring rotational displacement, and FIG. 8 shows a process of measuring rotational displacement by a displacement measuring unit.

As shown in FIGS. 2 to 8, a driving unit measuring apparatus "A" of one embodiment may include a flat nut 700, a crucible shaft inspection jig 600, and a displacement measuring unit 800.

The flat nut 700 may be detachably coupled to a pulling unit 500. More specifically, the flat nut 700 may be detachably coupled to a seed chuck located under a seed cable 510 of the pulling unit 500.

For example, the flat nut 700 may include a horizontal plate 720 and a weight connecting part 710.

As shown in FIGS. 2 and 3, the horizontal plate 720 is formed in a disc shape, and may have a size larger than a diameter of a seed chuck 530 of the pulling unit 500. A lower portion of the horizontal plate 720 may be formed to be flat, and may be disposed in a horizontal state.

The weight connecting part 710 is coupled to an upper portion of the horizontal plate 720, and may have a cylindrical shape having the same size as the diameter of the seed chuck 530. A lower portion of the seed chuck 530 may be formed with a coupling region having a smaller diameter and formed with screw threads.

The weight connecting part 710 may have screw threads formed on an inner side thereof for detachably coupling to the seed chuck 530. Therefore, a lower coupling region of the seed chuck 530 may be inserted into the inner side of the weight connecting part 710 while being screwed. The weight connecting part 710 may be coupled to the seed chuck 530 of the pulling unit 500 at the upper portion of the horizontal plate 720.

That is, the flat nut 700 including the above-described configuration may be mounted on the seed cable 510 while being coupled to the seed chuck 530. The flat nut 700 may be used as a reference point when measuring vertical displacement or rotational displacement of the seed cable 510 and the crucible shaft inspection jig 600. That is, a flat bottom surface of the horizontal plate 720 of the flat nut 700 may be a reference point of driving unit measurement. The horizontal plate 720 of the flat nut 700 may be disposed in parallel with the base plate 610 of the crucible shaft inspection jig 600 to be described later.

The crucible shaft inspection jig 600 may be detachably coupled to the crucible driving unit 400. The crucible shaft inspection jig 600 may be coupled to be replaced with the crucible shaft 410 of FIG. 1 described above when mounted on the single crystal growing apparatus 1 for measuring the driving unit. In addition, for measuring the driving unit, the crucible and crucible support of FIG. 1 may be separated from the chamber 100.

As shown in FIG. 6, the crucible shaft inspection jig 600 may include a base plate 610, a shaft 620, and a tapered bush 630.

The base plate 610 has a disk shape, and an upper surface thereof may be formed to be flat so as to be in parallel with the flat nut 700 described above.

The shaft 620 may have one end coupled to a central region of the base plate 610 and the other end coupled to the tapered bush 630. A length of the shaft 620 may be implemented with a size that is the same as or slightly smaller than that of the crucible shaft 410.

The tapered bush 630 is coupled with the other end of the shaft 620, and may have a pointed shape from an upper portion to a lower portion. The tapered bush 630 may be located at a lower portion of the shaft 620, and may fix the shaft 620 inside the crucible driving unit 400.

To this end, the shape of the tapered bush 630 may have a shape corresponding to a lower region of the crucible shaft 410. That is, the tapered bush 630 may be tightly coupled while being inserted in a tight fit shape in a tapered insertion groove inside the crucible driving unit 400 mounted with the crucible shaft 410.

The crucible shaft inspection jig 600 described above may further serve as a reference role for measuring a driving unit so as to improve accuracy of measurement. That is, since the crucible shaft 410 is consumables, it may be unsuitable as a reference for measuring the driving unit because it is worn or twisted after use.

Therefore, since the crucible shaft inspection jig 600 is mounted in a balanced and horizontal manner in the crucible driving unit 400, it may be used as a reference for measuring the displacement of the seed cable 510 of the pulling unit 500.

The displacement measuring unit 800 may be coupled to the flat nut 700 and the crucible shaft inspection jig 600, and may measure at least one of elevating and rotational displacement of the pulling unit 500 and the crucible driving unit 400.

First, the displacement measuring unit 800 may include at least one displacement sensor coupled to the crucible shaft inspection jig 600. The displacement sensor may measure displacement of the seed cable 510 or the crucible shaft inspection jig 600 during vertical movement. At this time, for more accurate measurement, the displacement sensor may have a plurality of displacement sensors 810 and 820 having different measurement ranges.

That is, the displacement measuring unit 800 may include a first displacement sensor 810 coupled to the crucible shaft inspection jig 600, and a second displacement sensor 820. The first displacement sensor 810 and the second displacement sensor 820 may be installed at an upper portion of the base plate 610 of the crucible shaft inspection jig 600. Since the base plate 610 is flat in the horizontal direction, the first displacement sensor 810 and the second displacement sensor 820 may measure an accurate displacement in the vertical direction.

For example, the first displacement sensor 810 and the second displacement sensor 820 may be laser sensors. Therefore, the first displacement sensor 810 and the second displacement sensor 820 emit laser upward and the emitted laser is reflected back from the horizontal plate 720 of the flat nut 700 located at an upper portion of the displacement sensors 810 and 820.

As shown in FIG. 4, when the crucible shaft inspection jig 600 is fixed and the seed cable 510 is vertically moved upward by using such a principle, the displacement sensors 810 and 820 may measure vertical displacement S/L from a reference point H1 to a movement point H2 of the horizontal plate 720.

On the other hand, as shown in FIG. 5, when a position of the seed cable 510 is fixed and the crucible shaft inspection jig 600 is moved vertically downward, the displacement sensors 810 and 820 may measure the vertical displacement S/L from the reference point H1 to a movement point H3 of the horizontal plate 720.

As described above, the displacement sensors 810 and 820 may precisely measure the vertical displacement S/L when the crucible shaft inspection jig 600 or the seed cable 510 is moved up and down.

Meanwhile, as shown in FIGS. 6 to 8, the displacement measuring unit 800 may further include a reference nut 830 coupled to the crucible shaft inspection jig 600 for measuring rotational displacement of the driving unit, and a proximity sensor 840 coupled to the flat nut 700.

The reference nut 830 may be installed at the upper portion of the base plate 610 of the crucible shaft inspection jig 600, and the proximity sensor 840 may be installed on the horizontal plate 720 of the flat nut 700.

The displacement measuring unit 800 further including the above-described configuration may measure rotational displacement when the seed cable 510 is rotated or the crucible shaft inspection jig 600 is rotated by the crucible shaft rotating part 420.

For example, as shown in FIG. 8, the proximity sensor 840 and the reference nut 830 may be disposed concentrically with respect to the rotation center axis of the flat nut 700 and the crucible shaft inspection jig 600. Therefore, as shown in FIG. 8A, the proximity sensor 840 and the reference nut 830 are concentrically spaced apart from each other, and as shown in FIG. 8B, when the crucible shaft inspection jig 600 or the seed cable 510 rotates, they may be overlapped with each other.

When the proximity sensor 840 counts a case overlapped with the reference nut 830 and measures the number of rotations, the displacement measuring unit 800 may measure the rotational displacement S/R and C/R of the crucible shaft inspection jig 600 or the seed cable 510.

Meanwhile, as shown in FIGS. 2 to 5, the displacement measuring unit 800 may further include guides 640, 650, and 660.

The guides 640, 650 and 660 may guide movement such that the crucible shaft inspection jig 600 and the flat nut 700 that cause vertical displacement or horizontal displacement during measurement of the driving unit are not separated from each other.

To this end, the guides 640, 650, and 660 may be coupled to the crucible shaft inspection jig 600 to guide the movement of the flat nut 700 and the crucible shaft inspection jig 600. For example, the guides 640, 650, and 660 may include a plurality of bar-shaped members coupled to edge regions of the base plate 610 of the crucible shaft inspection jig 600. The guides 640, 650, and 660 show that a total of three bar-shaped members are spaced from each other by a predetermined distance, but the present invention is not limited thereto, and may be implemented in various shapes and numbers.

As described above, according to the driving unit measuring apparatus of the present invention and the silicon single crystal growing apparatus including the same, since actual measurement of displacement (rotational speed and vertical movement) of a driving unit may be performed more precisely, driving errors of the driving unit may be reduced and quality dispersion may be improved.

Therefore, according to the driving unit measuring apparatus of the present invention and the silicon single crystal growing apparatus including the same, since actual measurement of displacement (rotational speed and vertical movement) of a driving unit may be performed more precisely, driving errors of the driving unit may be reduced and quality dispersion may be improved.

The features, structures, effects and the like described in the embodiments are included in at least one embodiment of the present invention and are not necessarily limited to only one embodiment. Furthermore, the features, structures, effects and the like illustrated in the embodiments may be combined or modified with other embodiments by those skilled in the art to which the embodiments belong. Accordingly, it is to be understood that such combination and modification are included in the scope of the present invention.

DESCRIPTION OF REFERENCE NUMERALS

1: single crystal growing apparatus 100: chamber
200: crucible 210: crystal crucible
220: graphite crucible 230: crucible support
300: heating unit 310: heat insulating material
400: crucible driving unit 410: crucible shaft
420: crucible shaft rotating part 430: crucible shaft pulling part
500: pulling unit 510: fixing part (seed cable)
520: pulling part 530: coupling part (seed chuck)
600: crucible shaft inspection jig 610: base plate
620: shaft 630: tapered bush
640, 650, 660: guide 700: flat nut
710: weight connecting part 720: horizontal plate
800: displacement measuring unit 810: first displacement sensor
820: second displacement sensor 830: reference nut
840: proximity sensor A: driving unit measuring apparatus

What is claimed is:

1. A driving unit measuring apparatus, the apparatus comprising:
   a crucible support for supporting a crucible;
   a pulling unit for elevating or rotating a seed at an upper portion of the crucible;
   a crucible driving unit for rotating or elevating the crucible support;
   a flat nut detachably coupled to the pulling unit;
   a crucible shaft inspection jig detachably coupled to the crucible driving unit; and
   a displacement measuring unit coupled to the flat nut and the crucible shaft inspection jig and measuring at least one of elevation and rotational displacement of the pulling unit and the crucible driving unit.

2. The apparatus of claim 1, wherein the crucible driving unit includes:
   a crucible shaft for rotating the crucible support;
   a crucible shaft rotating part for rotating the crucible shaft; and
   a crucible shaft pulling part for moving the crucible shaft up and down.

3. The apparatus of claim 2, wherein the crucible shaft inspection jig is coupled to be substituted for the crucible shaft.

4. The apparatus of claim 3, wherein the crucible shaft inspection jig includes:
   a base plate;
   a shaft having one end coupled to a central region of the base plate; and
   a tapered bush coupled to the other end of the shaft.

5. The apparatus of claim 4, wherein the base plate has a disk shape.

6. The apparatus of claim 5, wherein the base plate has a flat upper surface so as to be parallel to the flat nut.

7. The apparatus of claim 6, wherein the tapered bush has a pointed shape from an upper portion to a lower portion.

8. The apparatus of claim 7, wherein the flat nut includes:
   a horizontal plate disposed side by side with the base plate; and
   a weight connecting part coupled to the pulling unit from an upper portion of the horizontal plate.

9. The apparatus of claim 8, wherein the pulling unit includes:
   a seed cable;
   a pulling unit for elevating or rotating one end of the seed cable; and
   a seed chuck mounted to the other end of the seed cable.

10. The apparatus of claim 9, wherein the weight connecting part is detachably coupled to the seed chuck.

11. The apparatus of claim 10, wherein the weight connecting part has screw threads formed on an inner side thereof, and is screwed to the seed chuck.

12. The apparatus of claim 11, wherein the displacement measuring unit includes at least one displacement sensor coupled to the crucible shaft inspection jig.

13. The apparatus of claim 11, wherein the displacement measuring unit includes:
   a first displacement sensor coupled to the crucible shaft inspection jig;
   a second displacement sensor coupled to the crucible shaft inspection jig; and
   a reference nut coupled to the crucible shaft inspection jig.

14. The apparatus of claim 13, wherein the first and second displacement sensors and the reference nut are installed on an upper portion of the base plate of the crucible shaft inspection jig.

15. The apparatus of claim 14, wherein the displacement measuring unit further includes a proximity sensor coupled to the flat nut to measure rotational displacement.

16. The apparatus of claim 14, wherein the proximity sensor and the reference nut are disposed concentrically with respect to the rotation center axis of the flat nut and the crucible shaft inspection jig.

17. The apparatus of claim 16, wherein the displacement measuring unit further includes a guide coupled to the crucible shaft inspection jig to guide movement of the flat nut and the crucible shaft inspection jig.

18. The apparatus of claim 17, wherein the guide includes a plurality of bar-shaped members coupled to an edge region of the base plate of the crucible shaft inspection jig.

* * * * *